(12) United States Patent
Nikic et al.

(10) Patent No.: US 10,976,358 B2
(45) Date of Patent: Apr. 13, 2021

(54) SURFACE CHARGING SYSTEMS AND METHOD FOR CHARGING A NON-PLANAR SURFACE

(71) Applicant: The Boeing Company, Chicago, IL (US)

(72) Inventors: Dejan Nikic, Seattle, WA (US); Eddie Kwon, Seattle, WA (US)

(73) Assignee: The Boeing Company, Chicago, IL (US)

( * ) Notice: Subject to any disclaimer, the term of this patent is extended or adjusted under 35 U.S.C. 154(b) by 251 days.

(21) Appl. No.: 16/183,455

(22) Filed: Nov. 7, 2018

(65) Prior Publication Data
US 2020/0141993 A1 May 7, 2020

(51) Int. Cl.
*G01R 31/12* (2020.01)
(52) U.S. Cl.
CPC .................... *G01R 31/1263* (2013.01)
(58) Field of Classification Search
CPC .... G01R 31/01; G01R 31/12; G01R 31/1227; G01R 31/1263
See application file for complete search history.

(56) References Cited

U.S. PATENT DOCUMENTS

| | | | |
|---|---|---|---|
| 3,743,830 A * | 7/1973 | Takahashi | G03G 15/0291 250/325 |
| 3,861,955 A * | 1/1975 | Lemelson | B29C 49/22 427/131 |
| 3,928,034 A | 12/1975 | Regensburger | |
| 3,960,555 A | 6/1976 | Goffe | |
| 4,096,013 A | 6/1978 | Lutzmann et al. | |
| 4,875,060 A | 10/1989 | Masuda et al. | |
| 6,541,988 B2 | 4/2003 | Dangelmayer et al. | |
| 7,795,878 B2 | 9/2010 | Purdy et al. | |
| 8,439,560 B1 | 5/2013 | Ladd | |
| 10,120,014 B2 | 11/2018 | Nikic et al. | |
| 2005/0258842 A1 | 11/2005 | Maloney | |
| 2008/0093217 A1* | 4/2008 | Wu | G01N 21/658 204/450 |

(Continued)

OTHER PUBLICATIONS

Blythe et al., Characteristics of Propagating Electrostatic Discharges on Dielectric Films, Journal of Electrostatics, vol. 10, pp. 321-326, 1981.

(Continued)

*Primary Examiner* — Adolf D Berhane
(74) *Attorney, Agent, or Firm* — Dascenzo Gates Intellectual Property Law, P.C.

(57) ABSTRACT

Systems include a test object that comprises a surface having a non-planar topographical feature, and an electrode comprising a non-linear segment that is proximate to the non-planar topographical feature of the surface of the test object. The electrode is positioned proximate to but not in contact with the surface of the test object such that the perpendicular distances between the electrode and the surface of the test object are uniform across the electrode. The electrode is further configured to (i) be translated across the surface of the test object while maintaining the perpendicular distances between the electrode and the surface of the test object, and (ii) impart a layer of charge across the surface of the test object when the test object is translated across the surface.

20 Claims, 6 Drawing Sheets

(56) References Cited

U.S. PATENT DOCUMENTS

2010/0222771 A1* 9/2010 Mitchell ............... A61L 27/18
                                                     606/1
2014/0017821 A1    1/2014 Fenouillet-Beranger et al.

OTHER PUBLICATIONS

Abstract of Dahn et al., Propagating Brush Discharge Initiation of Dust Layers—A New Test Method, J. Phys. IV France, vol. 12. No. 7, pp. 65-69, Aug. 2002.

Yamaguma et al., Observation of Propagating Brush Discharge on Insulating Film With Grounded Antistatic Materials, IEEE Transactions on Industry Applications, vol. 40, No. 2, Mar./Apr. 2004.

Propagating Brush Discharge Testing and Breakdown Voltage Measurement, Dekra Insight, dekra-insight.com Knowledge Center, undated.

* cited by examiner

SURFACE CHARGING SYSTEMS AND METHOD FOR CHARGING A NON-PLANAR SURFACE

FIELD

The present disclosure relates to systems and methods for inducing an electrostatic charge on the surface of test objects.

BACKGROUND

Electrically insulative components proximate to electrically conductive grounded components act as capacitors which store a bi-layer of static electrical charge. Where large amounts of such electrostatic charge is accumulated, electrostatic discharges, or shocks, can occur. When these discharges occur in the presence of flammable substances, they can cause an ignition of the flammable substances. Accordingly, prevention and characterization of the risk of electrostatic accumulation and/or discharge for the surfaces of objects is important to industries which utilize insulative components in association with flammable environments. Example industries include fuel production, fuel transportation, vehicle operation, mining operations, chemical processing, metal fabrication, power plant construction and operation, and operations which involve combustible particulate such as sawdust, metal, flour, and grain.

Currently, to address this threat of combustion, discharge testing is used to test the risk of electrostatic charge accumulation and/or discharge associated with different insulative components (such as materials, fastening elements, joints, textural features, shapes, etc.). To conduct such discharge tests, a uniform electrostatic charge must first be applied across the surface of the object to be tested. Traditionally, corona wires and/or pin charging grids have been used to apply a uniform electrostatic charge to the surfaces of objects to be tested. However, these traditional methods are difficult to use, and are only able to apply uniform charge across flat surfaces. That is, traditional charging methods are unable to apply a uniform electrostatic charge across surfaces having irregular surfaces, such as ridges, sealing caps, complex surfaces, etc.

Discharge testing cannot be performed on objects having irregular surfaces, and the testing of such objects currently is being performed analytically using modeling. This currently results in conservative estimates of the risk of electrostatic charge accumulation and/or discharges, as due to their theoretical nature, analytical models are programmed to err on the side of conservative estimations. Because of this overestimation of the risk of electric discharges for objects having irregular surfaces, industries that utilize insulative components in association with flammable environments presently are forced to conduct redesigns and/or implement safety measures that may not actually be necessary.

SUMMARY

Systems and methods for inducing a charge on the surface of an object are disclosed. An example system for charging the surface of an object includes a test object that comprises a surface having a non-planar topographical feature, and an electrode comprising a non-linear segment that is proximate to the non-planar topographical feature of the surface of the test object. The electrode is positioned proximate to but not in contact with the surface of the test object, and the perpendicular distances between the electrode and the surface of the test object are uniform across the electrode. Moreover, the electrode is configured to (i) be translated across the surface of the test object while maintaining the perpendicular distances between the electrode and the surface of the test object and (ii) induce a layer of charge across the surface of the test object when the test object is translated across the surface.

In another example, the system for inducing a charge on the surface of an object includes a test object that comprises a surface having a non-planar topographical feature, and a charging mesh comprising a conductive material. The charging mesh has a topography that corresponds to the surface of the test object, and the charging mesh is positioned such that perpendicular distances between the charging mesh and the surface of the test object are uniform across the charging mesh. Moreover, the charging mesh is configured to (i) be translated towards and away from the surface of the test object and (ii) induce a layer of charge across the surface of the test object.

A method for inducing a charge on a non-planar surface of a test object includes initiating a voltage source electrically connected to an electrode, bringing the electrode to a desired potential, translating the electrode to a position proximate to but not in contact with the surface of the test object, and inducing a charge on the surface of the test object.

DESCRIPTION

Systems and methods for inducing an electrostatic charge on an irregular surface of an object are disclosed. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
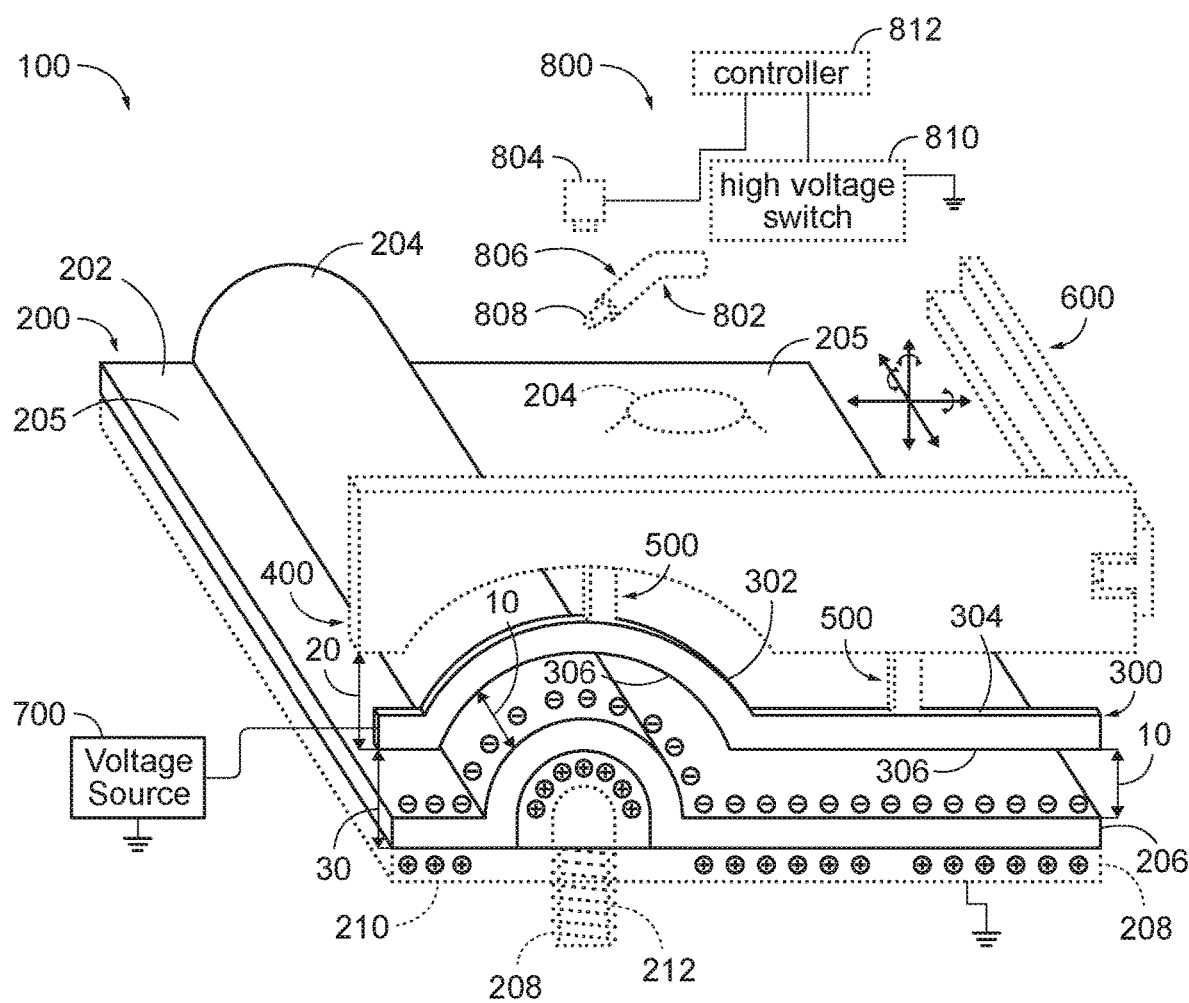
FIG. 1 is schematic diagram representing surface charging systems according to the present disclosure.

FIG. 1 is a schematic diagram representing a charging system 100 according to the present disclosure. In some embodiments, charging systems 100 may be referred to as systems for inducing charge on a surface, charge inducing systems, surface charging systems, and/or electrostatic charging systems. As schematically illustrated in FIG. 1, charging system 100 includes at least a test object 200 having a surface 202 that has a non-planar topographical feature 204, and an electrode 300 having a non-linear segment 302 that is proximate to the non-planar topographical feature 204. A non-planar topographical feature 204 may be a curved or angled portion of surface 202, a collection of planar regions of the surface 202 that are collectively non-planar, or a combination thereof. Similarly, a non-linear segment 302 may be a curved or angled portion of the electrode 300, a collection of multiple linear portions of the electrode 300 that are collectively non-linear, or a combination thereof. In some embodiments, the surface 202 also may have one or more planar regions 205. The electrode 300 is positioned proximate to but not in contact with the surface 202. In various embodiments, the non-planar topographical feature 204 may comprise a curved portion of the surface 202, a raised portion of the surface 202, a sunken region of the surface 202, or a combination thereof. For example, the non-planar topographical feature 204 may be a ridge in the test object where two separate portions of the surface 202 are fused, met, and/or are otherwise coupled together. In another example, the non-planar topographical feature 204 may be a recessed volume defined by a portion of the surface 202.

In some embodiments, the surface 202 may have multiple non-planar topographical features 204. For example, a surface 202 may include a first non-planar topographical feature 204 that corresponds to a ridge that results from an insulating material covering a joint where two components of the test object 200 meet, and a second non-planar topographical feature 204 that corresponds to a seal cap that covers a fastening mechanism that holds the two components of the test object 200 together.

The test object 200 is partially or completely composed of an electrically insulative material, such as a ceramic material, a dielectric material, glass, plastic, rubber, or wood. For example, the test object 200 may correspond to a portion of a fuel reservoir that is composed of a carbon fiber material. The test object 200 may include a surface layer 206 that includes the surface 202, and which is partially or completely composed of an electrically insulative material. In some embodiments, the surface layer 206 may be an insulative layer, a protective layer, and/or a sealant layer of the test object 200. For example, where the test object 200 is or corresponds to a portion of a reservoir for storing flammable substances, the surface layer 206 may be or correspond to an insulative coating that acts as a barrier that insulates electric charges of the environment surrounding the reservoir from flammable substances within the reservoir.

The test object 200 optionally may include other layers and/or components in addition to the surface layer 206. For example, the test object 200 may include a grounding material 208 that is proximate to the surface layer 206, and positioned such that the surface layer 206 is located between the grounding material 208 and the electrode 300. In some embodiments, the shape of the grounding material 208 is such that a perpendicular distance 30 between the grounding material 208 and the electrode 300 is constant across the electrode 300. The grounding material 208 may correspond to a grounding layer 210 that partially or completely comprises an electrically conductive material and which is electrically grounded. Alternatively or in addition, the grounding material 208 may correspond to a grounded component 212 of the test object 200 that is partially or completely made of an electrically conductive material. Examples of grounded components 212 include, but are not limited to, a bolt, a screw, a nail, and a fastening mechanism used to secure component pieces of the test object 200. In such embodiments, the surface layer 206 at least partially comprises an insulative region that electrically insulates the grounded component 212 from the surface 202.

As shown in FIG. 1, the surface charging system 100 also includes one or more electrodes 300. Individual electrodes 300 are partially or completely composed of a conductive material, and may comprise a wire, a blade, a rail, a bar, a sheet, and/or a conductive mesh. The electrodes 300 are shaped so as to carry a high enough voltage to ionize the fluid surrounding the electrodes 300 (e.g., air), while minimizing the chance that the voltage on the electrodes 300 will arc to the surface 202. For example, where the electrode is or includes a wire, the wire may have a diameter that is equal to or less than 100 µm. The shape of the electrode 300 is such that the perpendicular distances 10 between the electrode 300 and the surface 202 of the test object 200 is uniform across the electrode 300. That is, the shortest distance between each point along a charging edge 306 of the electrode 300 that is proximate to the surface 202 is uniform or substantially uniform across the length of the charging edge 306. In embodiments where the electrode 300 is a blade, the charging edge 306 may correspond to a sharp edge of the blade. According to the present disclosure, the perpendicular distances 10 being substantially uniform corresponds to the perpendicular distances 10 between the charging edge 306 and the surface 202 being within a threshold variance (e.g., within a percentage variance, a difference range, etc.) of a uniform value across a length of the charging edge 306. For example, the perpendicular distances 10 may be uniform within a threshold variance equal to or less than 1%, 2%, 5%, 10%, 15% or another percentage therebetween.

To achieve this uniform distance across the electrode 300, the electrode 300 comprises one or more non-linear segments 302 in which the charging edge 306 has a non-linear shape that is based upon associated non-planar topographical features 204. Specifically, the charging edge 306 of each non-linear segment of the electrode 300 may have a shape such that the perpendicular distances 10 between the charging edge 306 of the non-linear segment and the surface 202 of an associated non-planar topographical feature 204 is substantially the same along the length of the charging edge 306 of the non-linear segment. For example, where the electrode 300 is a wire, the non-linear segment 302 may correspond to a portion of the wire that is shaped so as to emulate a shape of a corresponding non-planar topographical feature 204.

The electrode 300 also may include one or more linear segment 304 that are proximate to associated planar regions 205 of the surface 202. The electrode 300 is positioned such that the perpendicular distances 10 between the charging edge 306 of the linear segment 304 and the planar region 205 is uniform, or substantially uniform, across the linear segment 304. Moreover, in some embodiments of the charging system 100 the perpendicular distances 10 between the charging edge 306 of the non-linear segment 302 and the non-planar topographical feature 204 across the non-linear segment 302 may be the same as the perpendicular distances 10 between the linear segment 304 and the planar region 205 across the linear segment 304. In this way, the perpendicular distances 10 between the charging edge 306 of the electrode 300 and the surface 202 is uniform, or substantially uniform, across the entire charging edge 306.

The electrode 300 is further configured to be translated in relation to the test object 200. During at least a portion of such a translation, the perpendicular distances 10 between the electrode 300 and the surface 202 remain uniform across the electrode 300. For example, the electrode 300 may be configured to be translated across the surface 202 of the test object 200 such that the perpendicular distances 10 between the charging edge 306 and the surface 202 remain substantially uniform during the translation of the electrode 300. In some embodiments, the electrode 300 may be configured such that it is able to translate within one or more degrees of freedom (e.g., x-axis, y-axis, z-axis, pitch, yaw, and roll). For example, the electrode 300 may be configured to be translated within a two dimensional plane that is parallel to at least a portion of the surface 202 (e.g., a planar region 205). The electrode 300 further may be configured to be translated toward the surface 202 and/or away from the surface 202. Alternatively, or in addition, the electrode 300 may be configured to pivot or rotate in relation to the test object 200 about an axis of rotation. In some embodiments, the axis of rotation about which the electrode 300 is configured to rotate may be perpendicular to a point on the surface 202.

As illustrated in FIG. 1, the electrode 300 is connected to a voltage source 700. The voltage source 700, when initiated, may bring the electrode 300 to a desired voltage potential. When the electrode 300 is brought to the desired voltage potential, an electrostatic charge is induced on the surface 202 proximate to the electrode 300. The electrostatic charge is induced on the surface 202 by ionizing the fluid (e.g., air) between the electrode 300 and the surface 202. Accordingly, in order for the surface 202 to be charged, a fluid must exist between the electrode 300 and the surface 202. For example, initiating the voltage source 700 may cause the electrode 300 to ionize air at standard temperature and pressure surrounding the electrode, where the ionized air then causes the surface 202 proximate to the electrode 300 to have an electrostatic charge induced thereon. In some embodiments, such as in vacuums, a fluid may need to be introduced between the electrode 300 and the surface 202 in order for the electrostatic charge to be induced on the surface 202.

In some embodiments, the amount of charge induced across the surface 202 of the test object 200 corresponds to a maximum theoretical charge for individual locations on the surface 202 for an associated potential of the electrode 300. The pattern in which the induced electrostatic charge is distributed on the surface 202 is based on a plurality of variables, which include, but are not limited to, a proximity between the electrode 300 and the given location, the proximity between the grounding material 208 and the given location, the potential of the electrode 300, and the material properties of the dielectric materials (e.g., the electrical permittivity). For example, when the electrode 300 is brought to a voltage potential by the voltage source 700 and then translated across the surface 202, the electrostatic charge induced on each location on the surface 202 is determined based on both the proximity of the location to the grounding material 208, and the proximity of the location to the charging edge 306 of the electrode 300 as the electrode 300 is translated across the location. In this way, when the electrode 300 is translated in relation to the surface 202 such that the perpendicular distances 10 between the electrode 300 and the surface 202 remains uniform across the electrode 300, the distribution pattern of the electrostatic charge induced on the surface 202 is dependent upon the characteristics of the grounding material 208 (e.g., the proximities between the grounding material 208 and individual locations on the surface 202). For example, where the surface layer 206 corresponds to a coating of uniform thickness disposed upon a grounding layer 210, then proximity of each point on the surface to both of the electrode 300 and the grounding material 208 would be uniform when the electrode 300 is translated across the surface 202. This would result in an electrostatic charge being induced in a uniform distribution pattern across the surface 202. That is, the electrostatic charge induced by the electrode 300 would be equally distributed across both the non-planar topographical features 204 and the planar regions 205. In some embodiments, the charge induced across the surface 202 by such a translation would be uniform within a threshold variance.

Alternatively, where the grounding material 208 is not a uniform distance from each point on the surface 202, the electrostatic charge induced by the translation of the electrode 300 would be distributed across the surface 202 in a non-uniform pattern. For example, a larger amount of electrostatic charge may be induced in a first location on the surface 202 that is more proximate to a grounding material 208 than a second location on the surface 202 that is less proximate to the grounding material 208. That is, regions of the surface 202 that are proximate to grounded components 212 will have disproportionally large electrostatic charges induced upon them in relation to other regions that are less proximate to grounded components 212. For example, where the grounding material 208 corresponds to a fastening mechanism, the region of the surface 202 proximate to the fastening mechanism may have a larger amount of electrostatic charge induced upon it.

As shown in FIG. 1, the charging system 100 also may optionally include one or more of a support structure 400, one or more spacers 500, and a frame 600. The support structure 400, when present, is configured to support the electrode 300 above the surface 202 of the test object 200. In some embodiments, the support structure 400 is configured to translate the electrode 300 in relation to the test object 200. For at least a portion of such a translation by the support structure 400 the perpendicular distances 10 between the electrode 300 and the surface 202 of the test object 200 are uniform across the electrode. That is, the support structure 400 may be configured to maintain uniform perpendicular distances 10 between the charging edge 306 and the surface 202 when the support structure 400 translates the electrode 300. In some embodiments, the support structure 400 may be configured to translate the electrode 300 such that the perpendicular distances 10 between the charging edge 306 and the surface 202 remain substantially uniform within a threshold variance (e.g., within a percentage variance, a difference range, etc.). For example, during translation of the electrode 300, the perpendicular distances 10 may remain uniform within a one millimeter threshold of variance. Additionally, in some embodiments the shape of the support structure 400 may correspond to the topography of the surface 202 of the test object. For example, the shape of the support structure 400 may be configured such that perpendicular distances 20 between the support structure 400 and the surface 202 and/or the perpendicular distances 10 between the electrode 300 and the surface 202 are uniform across the support structure 400 and/or the electrode 300.

FIG. 1 further illustrates that the charging system 100 optionally may include a frame 600, which is configured to guide the translation of the electrode 300 in relation to the test object 200. In some embodiments, the electrode 300 is coupled to the frame 600 via the support structure 400. Specifically, the support structure 400 may be engaged with the frame 600 such that the frame 600 guides the translation of the support structure 400 and the electrode 300 in one or more degrees of freedom. Additionally, the frame 600 may include motorized components that drive the translation of the support structure 400 and/or electrode 300. In some embodiments, the frame 600 may define an aperture over the test object 200, and the electrode 300 may extend across the aperture.

As depicted in FIG. 1, the charging system 100 optionally may include one or more spacers 500 that couple the electrode 300 to the support structure 400, and which maintain the position of the electrode 300 in relation to the support structure 400. The spacers 500 may extend from the support structure 400 parallel to the planar region 205 of the surface 202, may extend from the support structure 400 toward the surface 202, and/or a combination thereof. In various embodiments, one or more of the support structure 400, the one or more spacers 500, and/or the frame 600 are partially or completely composed of an electrically insulative material, such as a ceramic material, a dielectric material, glass, plastic, rubber, or wood.

As further shown in FIG. 1, the charging system 100 further may include the voltage source 700 electrically connected to the at least one electrode 300, and one or more testing components 800. The one or more testing components 800 may include an initiation electrode 802 and a sensor 804 configured to measure one or more of a brush discharge, a surface voltage potential, a surface charge density, and/or electrical field properties across the surface 202 of the test object 200. In some examples, the initiation electrode 802 includes a conductive material and insulating sheath 806 that is spaced apart from the surface 202 and which covers a portion of the conductive material such that an exposed tip 808 of the conductive material extends out of the insulating sheath 806. In some embodiments, the initiation electrode may be an insulated wire. The initiation electrode 802 is electrically insulated from the test object 200 and the exposed tip 808 may be positioned adjacent to, may be in contact with the surface 202, or may be movable there between. The sensor 804 may be positioned and configured to detect a brush discharge centered at the exposed tip 808 of the initiation electrode 802. In various embodiments, the sensor 804 may correspond to or include one or more of a flame sensor, an ion sensor, a pressure sensor, a temperature sensor, a microphone, a burst diaphragm, or a conformable element. For example, the sensor 804 may be an optical sensor that is positioned and configured to sense light generated at the surface 202 of the test object 200 due to the brush discharge. As another example, the optical sensor 804 may be positioned to detect light generated by ignition of a flammable gas in contact with the surface 202.

The one or more testing components 800 further may include a high-voltage switch 810 connected to the controller 812. The conductive material of the initiation electrode 802 may be selectively isolated from a ground potential. The controller 812 is programmed to operate the high-voltage switch 810 to electrically ground the initiation electrode. In some embodiments, the controller 812 also may be programmed to operate the sensor 804 to collect sensor data indicative of discharges between the surface 202 and the initiation electrode 802. In some embodiments, a current probe is connected to the initiation electrode 802 such that the current probe is able to capture information about the size and or temporal characteristics of discharges between the surface 202 and the initiation electrode 802.

Turning now to FIGS. 2-5, illustrative non-exclusive examples of charging system 100 are shown. Where appropriate, the reference numerals from the schematic illustration of FIG. 1 is used to designate corresponding parts of the examples of FIGS. 2-5; however, the examples of FIGS. 2-5 are non-exclusive and do not limit charging systems 100 to the illustrated embodiments of FIGS. 2-5. That is, charging systems 100 are not limited to the specific embodiments of FIGS. 2-5, and a charging system 100 may incorporate any number of the various aspects, configurations, characteristics, properties, etc. of the charging system 100 that is illustrated in and discussed with reference to the schematic representations of FIG. 1 and/or the embodiments of FIGS. 2-5, as well as variations thereof, without requiring the inclusion of all such aspects, configurations, characteristics, properties, etc. For the purpose of brevity, each previously discussed component, part, portion, aspect, region, etc. or variants thereof may not be discussed, illustrated, and/or labeled again with respect to the examples of FIGS. 2-5; however, it is within the scope of the present disclosure that the previously discussed features, variants, etc. may be utilized with the examples of FIGS. 2-5.

Figure 2:
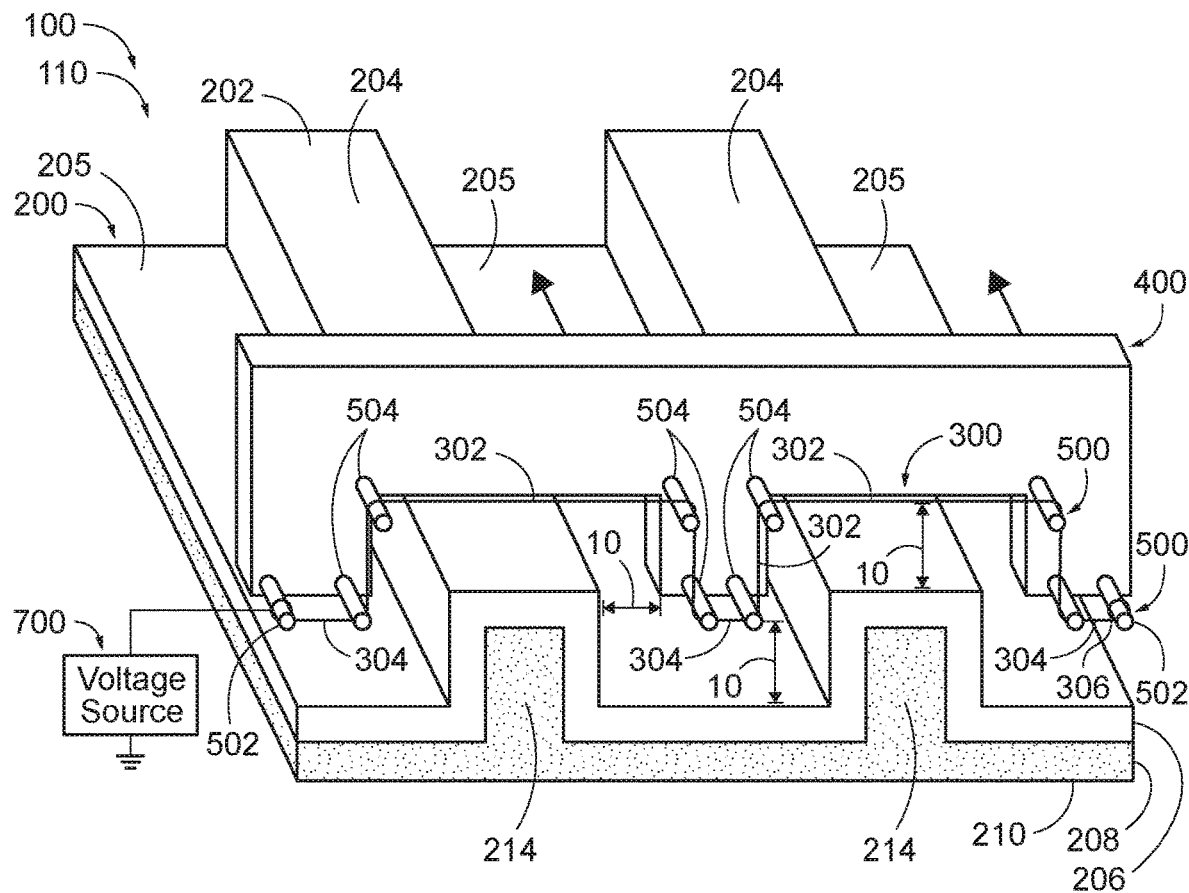
FIG. 2 is an isometric view of an example charging system where the electrode is a charging wire having multiple non-linear segments.

FIG. 2 is an isometric view of an example of charging system 100, indicated as charging system 110, where the electrode 300 is a charging wire having multiple non-linear segments 302. Charging system 110 includes a test object 200, and an electrode 300 that is coupled to a support structure 400 via a plurality of spacers 500. As shown in FIG. 2, the test object 200 includes a grounding layer 210 that is at least partially composed of a conductive material. The grounding layer 210 is shown as including multiple ridges 214 that project from the grounding layer 210 and that extend along a length of the grounding layer 210. FIG. 2 also shows the test object 200 as including a surface layer 206 deposited on top of the grounding layer 210 such that the surface 202 of the surface layer 206 is electrically insulated from the grounding layer 210. Surface 202 includes multiple non-planar topographical features 204 that each comprise a collection of multiple planar surfaces.

FIG. 2 further illustrates electrode 300 as being composed of a charging wire that has multiple non-linear segments 302 and multiple linear segments 304. As illustrated in FIG. 2, each non-linear segment 302 of the multiple non-linear segments 302 is a collection which comprises a collection of multiple linear segments. The shape and arrangement of the non-linear segments 302 and linear segments 304 are such that the perpendicular distances 10 between the charging edge 306 of the charging wire and the surface 202 of the test object 200 is uniform across both the non-planar topographical features 204 and the planar regions 205 of the surface 202. The charging wire may be made of any conductive material, and is connected to a voltage source 700 such that the charging wire may be brought to a desired electric potential.

The charging system 110 also includes a support structure 400 that is configured to translate the charging wire across the length of the test object parallel with the ridges 214. In this way, as the support structure 400 translates the charging wire, the perpendicular distances 10 between the charging edge 306 of the charging wire and the surface 202 of the test object 200 remains within a threshold variance (e.g., within a percentage variance, a difference range, etc.) of a uniform value throughout at least a portion of the translation. In some embodiments, when the charging wire is brought to an electric potential and then translated in this way, a uniform electrostatic charge is applied to the surface 202 of the test object 200. In FIG. 2, the charging wire is shown as being anchored on either end by anchor spacers 502. However, in other embodiments, the charging wire can be anchored by other structures, or may be anchored by the support structure 400. FIG. 2 also shows a plurality of spacer guides 504 that define the shape of the charging wire such that it includes multiple non-linear segments 302 and multiple linear segments 304.

Figure 3:
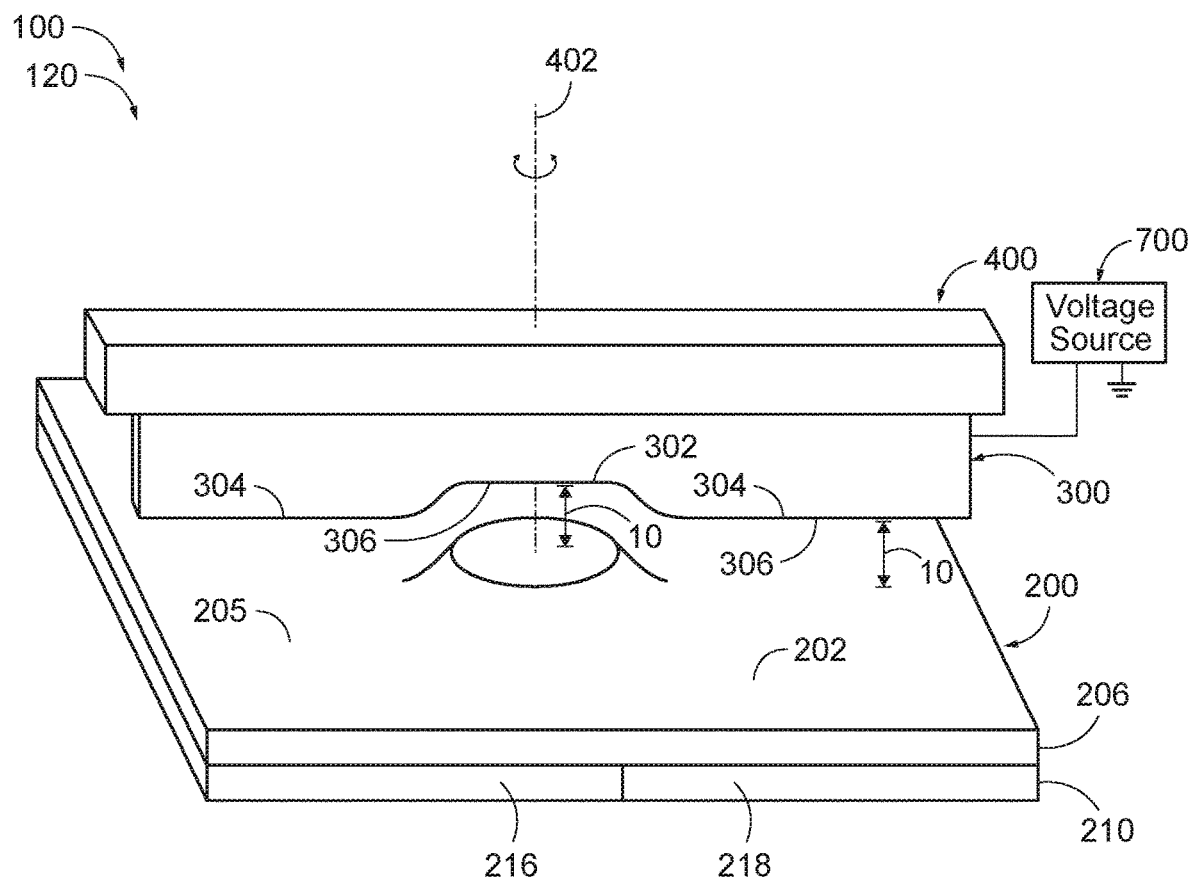
FIG. 3 is an isometric view of an example charging system where the electrode is a charging blade that is capable of being rotationally translated in relation to the test object.
Figure 4:
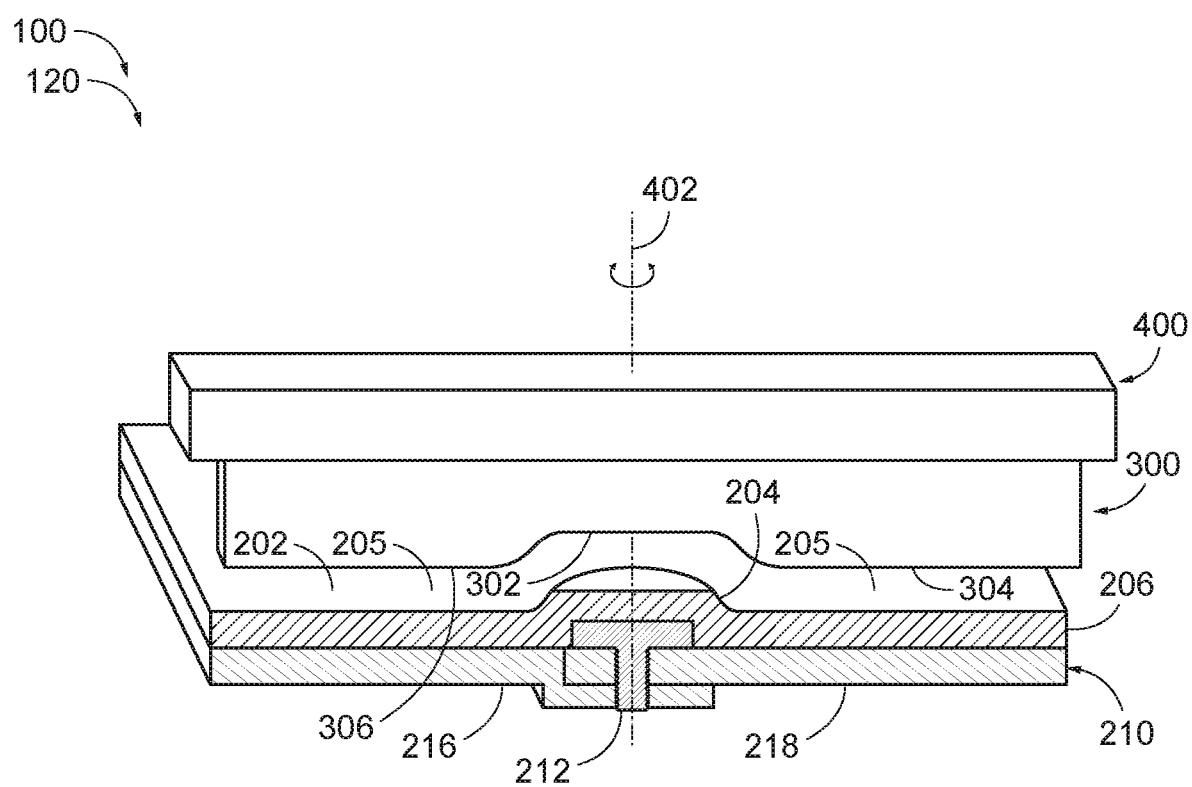
FIG. 4 is an isometric cross sectional view of the example charging system of FIG. 3.

FIGS. 3-4 are an isometric view and an isometric cross sectional view, respectively, which illustrate an example charging system 120, where the electrode 300 is a charging blade that is capable of being rotationally translated in relation to the test object 200. As seen in FIGS. 3-4, the charging system 120 is an example of a charging system 100 that includes a test object 200 and an electrode 300 that is coupled to a support structure 400.

Test object 200 of the charging system 120 includes grounding layer 210 that comprises a first component 216 of the grounding layer 210 and a second component 218 of the grounding layer 210, which are held together by a grounded component 212, seen in FIG. 4. In some embodiments, the first component 216, the second component 218, and/or the grounded component 212 may be partially or entirely composed of an electrically conductive material. Alternatively, in some embodiments, one or more of the first component 216, the second component 218, and/or the grounded component 212 may not comprise an electrically conductive material. FIG. 4 illustrates the grounded component 212 as being a fastening element that couples the first component 216 and the second component 218. FIGS. 3-4 illustrates that the test object 200 includes a surface layer 206 deposited on top of the grounding layer 210 such that the surface 202 of the surface layer 206 is electrically insulated from the grounding layer 210 and the grounded component 212.

FIGS. 3-4 further illustrates that electrode 300 is composed of a charging blade, wherein the edge of the charging blade corresponds to a charging edge 306. In the example charging system 120, the charging edge 306 comprises a non-linear segment 302 and multiple linear segments 304. The shape and arrangement of the non-linear segment 302 and the linear segments 304 are such that the perpendicular distances 10 between the charging edge 306 of the charging blade and the surface 202 of the test object 200 is uniform across both the non-planar topographical features 204 and the planar regions 205 of the surface 202. The charging blade may be made of any conductive material, and is connected to a voltage source 700, shown in FIG. 3, such that the charging edge 306 of the charging blade may be brought to a desired electrical potential.

As shown in FIGS. 3-4, the charging blade is coupled to a support structure 400 that is configured to translate the charging blade rotationally about an axis of rotation 402. In some embodiments, the support structure 400 is able to rotate the charging blade such that the perpendicular distances 10 between the charging edge 306 of the charging wire and the surface 202 of the test object 200 remains within a threshold variance (e.g., within a percentage variance, a difference range, etc.) of a uniform value throughout at least a portion of the rotation. In some embodiments, when the charging blade is brought to an electric potential and then translated in this way, a uniform electrostatic charge may be applied to the surface 202 of the test object 200.

Figure 5:
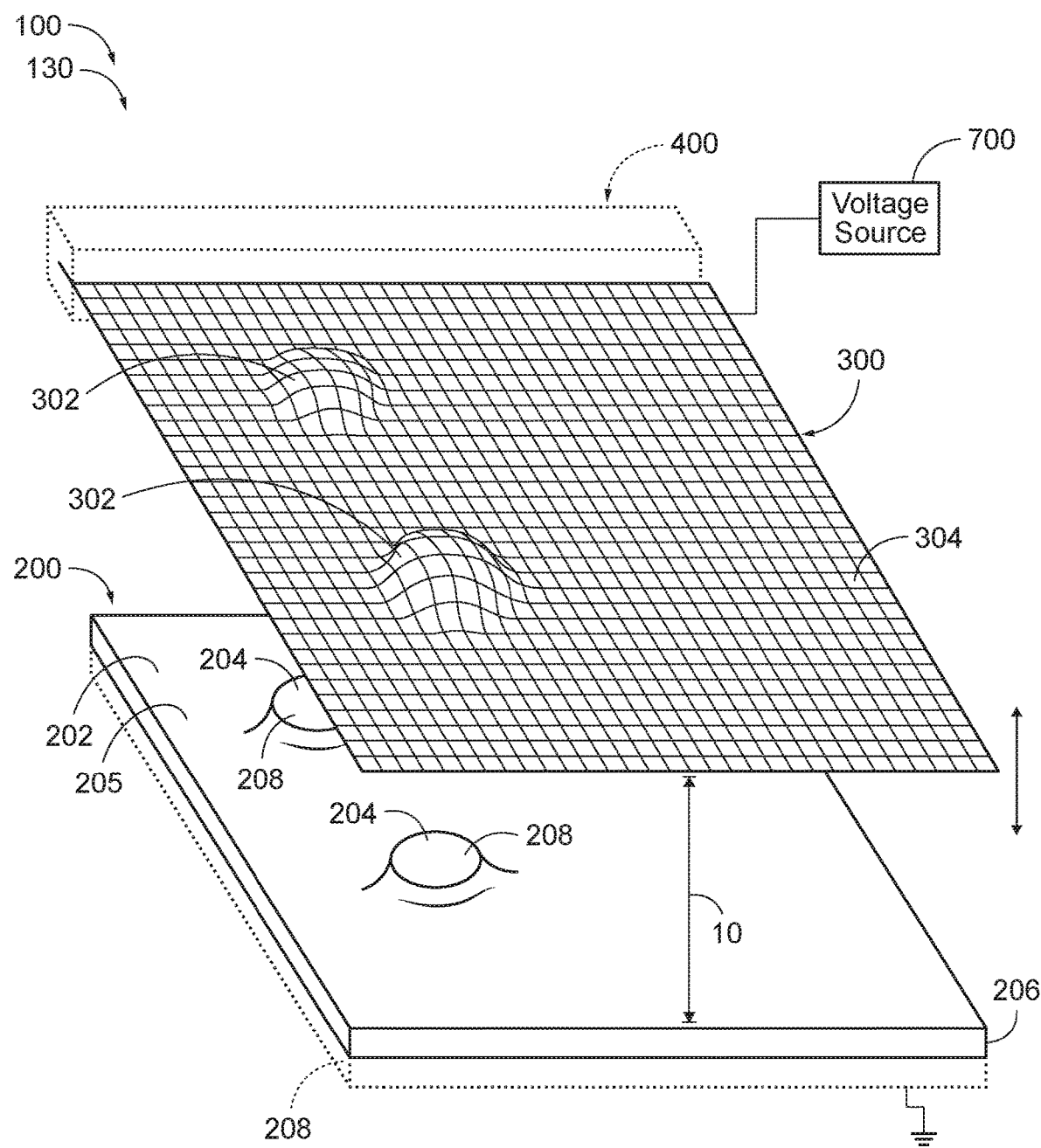
FIG. 5 is a schematic diagram representing an example surface charging system where the electrode is a charging mesh having multiple non-linear segments.

FIG. 5 is an isometric schematic view of an example of charging system 100, which illustrates an example charging system 130, where the electrode 300 is a charging mesh having multiple non-linear segments 302. Charging system 130 includes a test object 200 and an electrode 300 that is optionally coupled to a support structure 400.

As shown in FIG. 5, the test object 200 includes a surface layer 206 having a surface 202. The test object 200 includes two non-planar topographical features 204 and a planar region 205. FIG. 5 also illustrates test object 200 as optionally including a grounding material 208 positioned proximate to the surface layer 206 and opposite the surface 202. FIG. 5 also shows electrode 300 as corresponding to a charging mesh having multiple non-linear segments 302 and multiple linear segments 304. The shape and arrangement of the non-linear segments 302 and linear segments 304 are such that the perpendicular distances 10 between the charging mesh wire and the surface 202 of the test object 200 is uniform across both the non-planar topographical features 204 and the planar regions 205 of the surface 202. That is, in some embodiments, the topography of the charging mesh is such that perpendicular distances 10 between the charging mesh and the non-planar topographical features 204 are uniform across each non-planar topographical feature 204.

The charging mesh may be made of any conductive material, and is connected to a voltage source 700 such that the charging mesh may be brought to a desired electrical potential. In various embodiments, the charging mesh may comprise one or more interwoven wires, a sheet of conductive material, a stamped mesh structure, welded meshwork, and/or a lattice that is/are at least partially composed of a conductive material. In FIG. 5, the charging wire is shown as being coupled to an optional support structure 400 that is configured to translate the charging mesh toward the surface 202 and away from the surface 202. The example charging system 130 also may optionally include a frame 600 configured to guide the translation of the charging mesh.

Alternatively or in addition, the support structure 400 may be configured to translate the charging mesh within one or more other degrees of freedom. In some embodiments, the support structure 400 is able to translate the charging mesh such that the perpendicular distances 10 between the charging mesh and the surface 202 of the test object 200 across the charging mesh remain within a threshold variance (e.g., within a percentage variance, a difference range, etc.) of a uniform value throughout at least a portion of the translation. In some embodiments, when the charging mesh is brought to an electric potential and then translated in this way, a uniform electrostatic charge may be applied to the surface 202 of the test object 200. In some embodiments, to preserve the electrostatic charge on the surface 202, the support structure 400 is configured to translate the charging mesh away from the surface 202 before the voltage source 700 is uninitiated.

Figure 6:
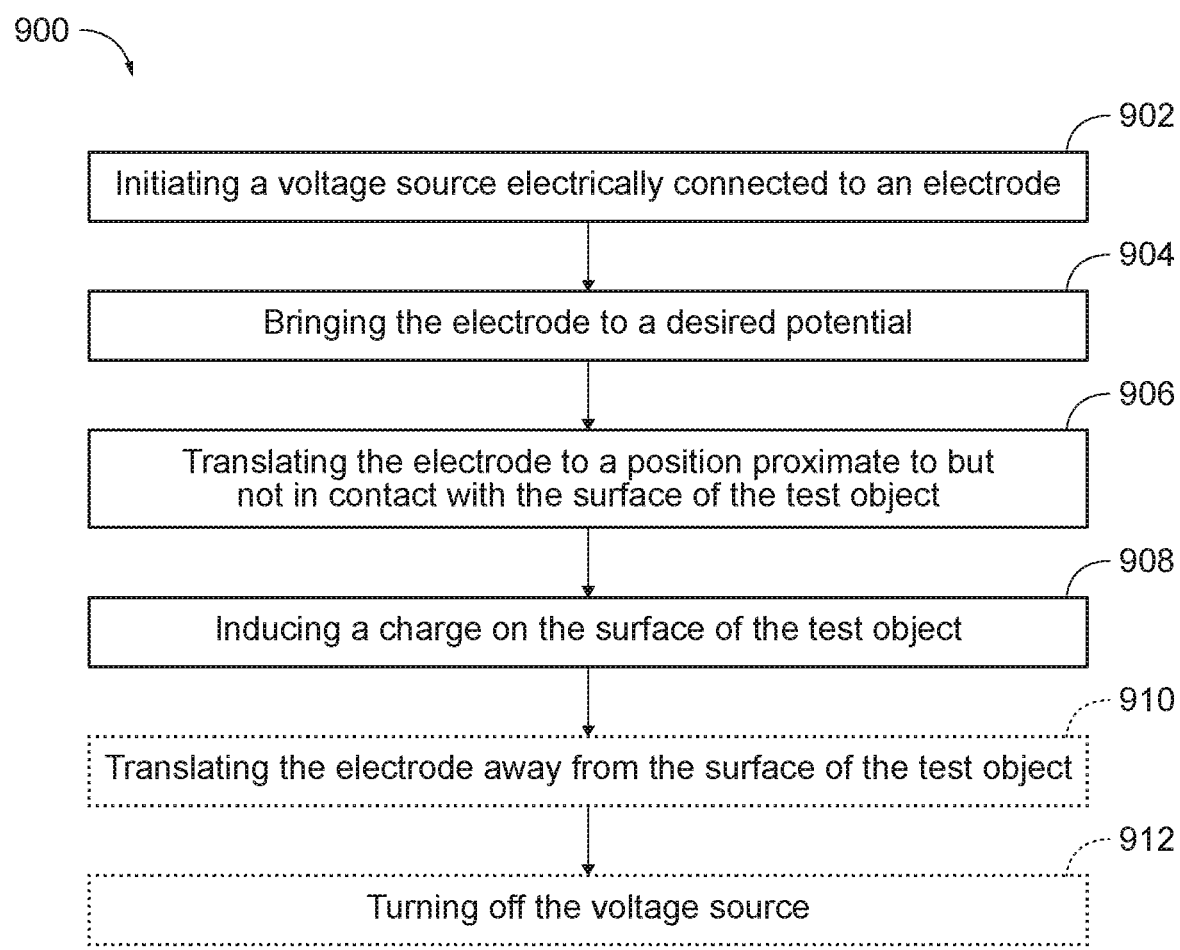
FIG. 6 is a flowchart schematically representing methods for charging a surface of a test object according to the present disclosure.

FIG. 6 schematically provides a flowchart that represents illustrative, non-exclusive examples of methods according to the present disclosure. In FIG. 6, some steps are illustrated in dashed boxes indicating that such steps may be optional or may correspond to an optional version of a method according to the present disclosure. That said, not all methods according to the present disclosure are required to include the steps illustrated in solid boxes. The methods and steps illustrated in FIG. 6 are not limiting and other methods and steps are within the scope of the present disclosure, including methods having greater than or fewer than the number of steps illustrated, as understood from the discussions herein. In some instances, the methods may be performed by or using one or more of the charging systems 100 disclosed above, or any components thereof.

FIG. 6 is a flowchart schematically representing methods 900 for charging a surface of a test object. Methods 900 include initiating a voltage source electrically connected to an electrode at 902. In various embodiments, the electrode may comprise a wire, a blade, a rail, a bar, a sheet, and a conductive mesh. The electrode may partially or completely comprise an electrically conductive material. The electrode may further comprise a charging edge that corresponds to the surface of the electrode that is closest to the surface of the test object. For example, in examples where the electrode is a blade, the edge may correspond to the sharp edge of the blade. The shape of the electrode is such that the perpendicular distance between the electrode and the surface of the test object is uniform across the electrode.

For example, the electrode comprises at least one non-linear segment that has a shape based upon an associated non-planar topographical feature. The shape of each non-linear segment of the electrode may be such that the perpendicular distances between the charging edge of the non-linear segment and the surface of an associated non-planar topographical feature is substantially the same along the length of the charging edge. In some examples, the electrode may also comprise at least one linear segment that is proximate to a planar region of the surface of the test object. The perpendicular distance between the charging edge of the linear segment and the planar region may be uniform or substantially uniform across the linear segment. In this way, the shortest distance between each point along a charging edge of the electrode that is proximate to the surface is uniform or substantially uniform across the length of the charging edge. The perpendicular distances being substantially uniform corresponds to the perpendicular distances between the charging edge and the surface being within a threshold variance (e.g., within a percentage variance, a difference range, etc.) of a uniform value across the length of the charging edge.

At 904, the electrode is brought to a desired potential. Bringing the electrode to the desired potential is based on the voltage source creating a voltage across the electrode. In some examples, the charging edge may be partially or completely composed of an electrically conductive material, and when the voltage source is initiated, the charging edge is brought to a desired potential. In some examples, bringing the electrode to the desired potential may correspond to adjusting the voltage applied to the electrode by the voltage source. For example, the voltage applied to the electrode may be adjusted so that the electrode will induce a desired amount of electrostatic charge on the surface of the test object.

At 906, the electrode is translated to a position proximate to but not in contact with the surface of the test object. In some examples, translating the electrode may include translating the electrode across the surface of the test object. In addition, the electrode may optionally be coupled to a support structure that is configured to translate the electrode within one or more degrees of freedom in relation to the test object. For example, the support structure may translate the electrode along a path across the surface of the test object. Alternatively or in addition, the support structure may be able to translate the electrode toward the surface and/or rotate the electrode about an axis of rotation.

In some embodiments, translating the electrode to a position proximate to but not in contact with the surface of the test object comprises translating the electrode such that a uniform perpendicular distance between the electrode and the surface of the test object is maintained over at least a portion of the translation. Alternatively or in addition, translating the electrode to a position proximate to but not in contact with the surface of the test object may comprise translating the electrode towards the surface of the test object to achieve a desired perpendicular distance between the electrode and the surface of the test object. For example, where the electrode is a charging mesh, translating the electrode may include moving the charging mesh to a position where the perpendicular distances between the planar regions and the charging mesh and the perpendicular distances between the non-planar topographical feature and the charging mesh are the same.

At 908, an electrostatic charge is induced on the surface of the test object. In some examples, inducing the charge may include applying a uniform amount of charge per unit area across the planar region and the topographical feature. Alternatively or in addition, the amount of charge induced across the surface of the test object may correspond to a maximum theoretical charge for individual locations on the surface for an associated potential of the electrode. The pattern in which the induced electrostatic charge is distributed on the surface may be based on a plurality of variables, such as the proximity between the electrode and the given location, the proximity between the grounding material and the given location, and the potential of the electrode, etc.

At 910, the electrode is optionally translated away from the surface of the test object. The voltage source is then optionally turned off at 912. Once the voltage source is turned off, the electrode is no longer at the desired potential, and returns to its uncharged state. Because the electrode is translated away from the surface of the test object prior to turning off the voltage source, the electrostatic charge induced upon the surface of the test object remains on the surface of the test object. That is, when the perpendicular distance between the electrode and the surface of the test object is greater than a threshold distance, the electrostatic charge on the surface of the test object is not drawn to the electrode.

Illustrative, non-exclusive examples of inventive subject matter according to the present disclosure are described in the following enumerated paragraphs:

A1. A surface charging system, comprising:
a test object that comprises a surface having a non-planar topographical feature; and
an electrode comprising a non-linear segment that is proximate to the non-planar topographical feature of the surface of the test object, wherein the electrode is positioned proximate to but not in contact with the surface of the test object such that perpendicular distances between the electrode and the surface of the test object are uniform across the electrode, and wherein the electrode is configured to:
 be translated across the surface of the test object while maintaining the perpendicular distances between the electrode and the surface of the test object, and
 impart a layer of charge across the surface of the test object when the test object is translated across the surface.

A1.1. The surface charging system of paragraph A1, wherein the electrode is configured such that, when a voltage is applied to the electrode, a uniform amount of charge per unit area is applied to the surface of the test object when the electrode is translated across the surface of the test object.

A1.2. The surface charging system of paragraph A1.1, wherein the uniform amount of charge applied across the surface of the test object is uniform within a threshold variance.

A1.3. The surface charging system of paragraph A1, wherein a distribution pattern of charge within the layer of charge imparted across the surface of the test object corresponds to a maximum theoretical charge for individual locations on the surface for an associated potential of the electrode.

A2. The surface charging system of any of paragraphs A1-A1.2, wherein the non-planar topographical feature comprises at least one of a curved portion of the surface, a raised portion of the surface, and a sunken region of the surface.

A2.1. The surface charging system of any of paragraphs A1-A2.1, wherein the non-planar topographical feature comprises a seal cap.

A2.2. The surface charging system of any of paragraphs A1-A2.1, wherein perpendicular distances between the non-linear segment and the non-planar topographical feature are uniform across the non-linear segment.

A3. The surface charging system of any of paragraphs A1-A2.2, wherein the surface of the test object further has a planar region.

A3.1. The surface charging system of paragraph A3, wherein the electrode further comprises a linear segment that is proximate to the planar region of the surface of the test object.

A3.2. The surface charging system of paragraph A3.1, wherein the electrode is positioned such that perpendicular distances between the linear segment of the electrode and the planar region of the surface of the test object is uniform across the linear segment.

A3.3. The surface charging system of paragraph A3.2, wherein the perpendicular distances between the linear segment and the planar region of the surface and the perpendicular distances between the non-linear segment and the non-planar topographical feature of the surface are the same.

A4. The surface charging system of any of paragraphs A1-A3.3, wherein the surface of the test object further has an additional non-planar topographical feature.

A4.1. The surface charging system of paragraph A4, wherein the additional non-planar topographical feature comprises an additional curved portion of the surface, an additional raised portion of the surface, and an additional sunken region of the surface.

A4.2. The surface charging system of any of paragraphs A4-A4.1, wherein the electrode further comprises an additional non-linear segment proximate to the additional non-planar feature.

A4.3. The surface charging system of any of paragraphs A4-A4.2, wherein perpendicular distances between the additional non-linear segment and the additional non-planar topographical feature are uniform across the additional non-linear segment.

A4.4. The surface charging system of paragraph A4.3, wherein the perpendicular distances between the non-linear segment and the non-planar topographical feature of the surface and the perpendicular distances between the additional non-linear segment and the additional non-planar topographical feature of the surface are the same.

A5. The surface charging system of any of paragraphs A1-A4.3, wherein the test object is partially or completely composed of an electrically insulative material.

A5.1. The surface charging system of any of paragraphs A1-A5, wherein the test object is at least a portion of a fuel reservoir.

A6. The surface charging system of any of paragraphs A1-A5.1, wherein the test object comprises a surface layer that includes the surface of the test object.

A6.1. The surface charging system of paragraph A6, wherein a thickness of the surface layer is less than one centimeter.

A6.2. The surface charging system of any of paragraphs A6-A6.1, wherein the surface layer is partially or completely composed of an electrically insulative and/or dielectric material.

A7. The surface charging system of any of paragraphs A6-A6.2, wherein the test object further comprises a grounding material that is proximate to the surface layer and positioned such that the surface layer is between the grounding material and the electrode.

A7.1. The surface charging system of paragraph A7, wherein the grounding material corresponds to a grounding layer.

A7.1.1. The surface charging system of paragraph A7.1, wherein a shape of the grounding layer is such that a perpendicular distance between the grounding layer and the electrode is constant.

A7.1.2. The surface charging system of any of paragraphs A7.1-A7.1.1, wherein the grounding layer comprises an electrically conductive material that is grounded.

A7.2. The surface charging system of any of paragraphs A7.1-A7.1.2, wherein the grounding layer is a functional component of the test object.

A7.2.1. The surface charging system of paragraph A7.2, wherein the functional component is one of a bolt, a screw, a nail, and a fastening mechanism.

A8. The surface charging system of paragraph A1, further comprising a support structure configured to support the electrode above the surface of the test object such that the perpendicular distances between the electrode and the surface of the test object are uniform across the electrode.

A8.1. The surface charging system of paragraph A8, wherein the support structure is configured to translate the electrode in relation to the surface of the test object.

A8.1.1. The surface charging system of paragraph A8.1, wherein the support structure is configured to maintain uniform perpendicular distances between the electrode and the surface of the test object across the electrode when the support structure translates the electrode.

A8.1.2. The surface charging system of any of paragraphs A8.1-A8.1.1, wherein the perpendicular distances between the surface of the test object and the electrode remain within a threshold variance of a predetermined distance above the surface of the test object when the support structure translates the electrode.

A8.1.3. The surface charging system of any of paragraphs A8.1-A8.1.2, wherein the support structure is configured to translate the electrode within a two-dimensional plane parallel to a planar region of the surface of the test object.

A8.1.4. The surface charging system of any of paragraphs A8.1-A8.1.3, wherein the support structure is configured to rotate the electrode about an axis of rotation perpendicular to the surface of the test object.

A8.1.5. The surface charging system of any of paragraphs A8.1-A8.1.4, wherein the support structure is configured to translate the electrode in a direction toward and/or a direction away from the surface of the test object.

A8.1.6. The surface charging system of paragraph A8.1.5, wherein the support structure is configured to translate the electrode in a direction toward and/or a direction away from the surface of the test object along an axis perpendicular to the surface of the test object.

A8.2. The surface charging system of any of paragraphs A8-A8.1.6, wherein a shape of the support structure matches the surface of the test object.

A8.3. The surface charging system of any of paragraphs A8-A8.2, wherein the shape of the support structure is configured such that the perpendicular distances between the electrode and the surface of the test object are uniform across the electrode.

A8.4. The surface charging system of any of paragraphs A8-A8.3, wherein the support structure is partially or completely composed of an electrically insulative material.

A9. The surface charging system of any of paragraphs A1-A8.4, wherein the surface charging system further comprises a frame configured to guide the translation of the electrode across the surface of the test object.

A9.1. The surface charging system of paragraph A9, wherein the frame defines an aperture and the electrode extends across the aperture.

A10. The surface charging system of any of paragraphs A9-A9.1, wherein the electrode is coupled to the frame via the support structure.

A10.1. The surface charging system of any of paragraphs A9-A10, wherein the frame is partially or completely composed of an electrically insulative material.

A11. The surface charging system of any of paragraphs A8-A10.1, further comprising at least one spacer, wherein the electrode is coupled to the support structure via the at least one spacer.

A11.1. The surface charging system of paragraph A11, wherein each of the at least one spacer is configured to maintain a position of the electrode in relation to the support structure.

A11.2. The surface charging system of any of paragraphs A11-A11.1, wherein the at least one spacer extends from the support structure parallel to the planar region of the surface of the test object.

A11.3. The surface charging system of any of paragraphs A11-A11.2, wherein the at least one spacer extends from the support structure toward the surface of the test object.

A11.4. The surface charging system of any of paragraphs A11-A11.3, wherein the at least one spacer is partially or completely composed of an electrically insulative material.

A11.4.1. The surface charging system of paragraph A11.4, wherein the at least one spacer is partially or completely composed of a ceramic material.

A12. The surface charging system of any of paragraphs A1-A11.4.1, wherein the electrode comprises a wire.

A12.1. The surface charging system of paragraph A12, wherein the wire is shaped to correspond to the surface of the test object.

A13. The surface charging system of any of paragraphs A1-A11.4.1, wherein the electrode comprises a blade.

A13.1. The surface charging system of paragraph A13, wherein the blade is shaped to correspond to the surface of the test object.

A13.2. The surface charging system of any of paragraphs A13-A13.1, wherein the blade comprises a conductive material, and has an edge located along a side of the blade that is proximate to the surface of the test object.

A13.2.1. The surface charging system of paragraph A12.2, wherein perpendicular distances between the edge of the blade and the surface of the test object are uniform across the edge of the blade.

A13.2.2. The surface charging system of paragraph A12.2.1, wherein the perpendicular distances between each point of the edge of the blade and the surface of the test object remain within a threshold variance of a predetermined distance above the surface of the test object when the support structure translates the blade.

A14. The surface charging system of any of paragraphs A.4-A13.2.2, wherein the surface charging system further comprises an additional electrode having a different shape corresponding to the additional non-planar topographical feature of the surface of the test object.

A14.1. The surface charging system of paragraph A13, wherein the support structure further supports the additional electrode above the surface of the test object such that the additional electrode is positioned at a predetermined distance above the surface of the test object.

B1. A surface charging system, comprising:
a test object that comprises a surface having a non-planar topographical feature; and
a charging mesh comprising a conductive material, wherein the charging mesh has a topography that corresponds to the surface of the test object, the charging mesh is positioned such that perpendicular distances between the charging mesh that the surface of the test object are uniform across the charging mesh, and the charging mesh is configured to:
be translated towards and away from the surface of the test object; and
impart a layer of charge across the surface of the test object.

B1.1. The surface charging system of paragraph B1, wherein the charging mesh is configured such that, when a voltage is applied to the charging mesh, a uniform amount of charge per unit area is applied to the surface of the test object.

B1.2. The surface charging system of paragraph B1.1, wherein the uniform amount of charge applied across the surface of the test object is uniform within a threshold variance.

B1.3. The surface charging system of paragraph B1, wherein a distribution pattern of charge within the layer of charge imparted across the surface of the test object corresponds to a maximum theoretical charge for individual locations on the surface for an associated potential of the charging mesh.

B1.2. The surface charging system of any of paragraphs B1-B1.3, wherein the charging mesh is partially or completely composed of an electrically conductive material.

B1.2.1. The surface charging system of paragraph B1.2, wherein the charging mesh comprises a plurality of interwoven conductive wires.

B2. The surface charging system of any of paragraphs B1-B1.2.1, wherein the non-planar topographical feature comprises at least one of a curved portion of the surface, a raised portion of the surface, and a sunken region of the surface.

B2.1. The surface charging system of any of paragraphs B1-B2, wherein the non-planar topographical feature comprises a seal cap.

B2.2. The surface charging system of any of paragraphs B2-B2.1, wherein the topography of the charging mesh is such that perpendicular distances between the charging mesh and the non-planar topographical feature are uniform across the non-planar topographical feature.

B3. The surface charging system of any of paragraphs B1-B2.2, wherein the surface of the test object further has a planar region.

B3.1. The surface charging system of paragraph B3, wherein the topography of the charging mesh is such that perpendicular distances between the charging mesh and the planar region of the surface of the test object are uniform across the planar region of the surface.

B4. The surface charging system of any of paragraphs B1-B3.1, wherein the surface of the test object further has an additional non-planar topographical feature.

B4.1. The surface charging system of paragraph B4, wherein the additional non-planar topographical feature comprises an additional curved portion of the surface, an additional raised portion of the surface, and an additional sunken region of the surface.

B4.2. The surface charging system of any of paragraphs B4-B4.1, wherein the topography of the charging mesh is such that perpendicular distances between the charging mesh and the additional non-planar topographical feature are uniform across the additional non-planar topographical feature.

B5. The surface charging system of any of paragraphs B1-B4.2, wherein the test object is partially or completely composed of an electrically insulative material.

B5.1. The surface charging system of any of paragraphs B1-B5, wherein the test object is at least a portion of a fuel reservoir.

B6. The surface charging system of any of paragraphs B1-B5.1, wherein the test object comprises a surface layer that includes the surface of the test object.

B6.1. The surface charging system of paragraph B6, wherein a thickness of the surface layer is less than one centimeter.

B6.2. The surface charging system of any of paragraphs B6-B6.1, wherein the surface layer is partially or completely composed of an electrically insulative material.

B6.3. The surface charging system of any of paragraphs B6-B6.2, wherein the surface layer is partially or completely composed of a dielectric material.

B7. The surface charging system of any of paragraphs B6-B6.3, wherein the test object is a grounding material that is proximate to the surface layer opposite the surface of the test object.

B7.1. The surface charging system of paragraph B7, wherein the grounding material corresponds to a grounding layer.

B7.1.1. The surface charging system of paragraph B7.1, wherein a shape of the grounding layer is such that perpendicular distances between the grounding layer and the charging mesh are constant.

B7.1.2. The surface charging system of any of paragraphs B7.1-B7.1.1, wherein the grounding layer comprises an electrically conductive material that is grounded.

B7.2. The surface charging system of any of paragraphs B7.1-B7.1.2, wherein the grounding layer is a functional component of the test object.

B7.2.1. The surface charging system of paragraph B7.2, wherein the functional component one of a bolt, a screw, a nail, and a fastening mechanism.

B8. The surface charging system of paragraph B1, further comprising a support structure configured to support the charging mesh above the surface of the test object such that the perpendicular distances between the charging mesh and the surface of the test object are uniform across the charging mesh.

B8.1. The surface charging system of paragraph B8, wherein the support structure is configured to translate the charging mesh in relation to the surface of the test object.

B8.1.1. The surface charging system of paragraph B8.1, wherein the support structure is configured to translate the charging mesh along an axis perpendicular to a point on the surface of the test object.

B8.2. The surface charging system of any of paragraphs B8-B8.1.1, wherein the support structure is partially or completely composed of an electrically insulative material.

B9. The surface charging system of any of paragraphs B1-B8.2, wherein the surface charging system further comprises a frame configured to guide the translation of the charging mesh.

B9.1. The surface charging system of paragraph B9, wherein the frame defines an aperture and the charging mesh extends across the aperture.

B10. The surface charging system of any of paragraphs B9-B9.1, wherein the charging mesh is coupled to the frame via the support structure.

B10.1. The surface charging system of any of paragraphs B9-B10, wherein the frame is partially or completely composed of an electrically insulative material.

B11. The surface charging system of any of paragraphs B9-B10.1, further comprising at least one spacer, wherein the charging mesh is coupled to the support structure via the at least one spacer.

B11.1. The surface charging system of paragraph B11, wherein each of the at least one spacer is configured to maintain a position of the charging mesh in relation to the support structure.

B11.2. The surface charging system of any of paragraphs B11-B11.1, wherein the at least one spacer extends from the support structure parallel to the planar region of the surface of the test object.

B11.3. The surface charging system of any of paragraphs B11-B11.2, wherein the at least one spacer extends from the support structure toward the surface of the test object.

B11.4. The surface charging system of any of paragraphs B11-B11.3, wherein the at least one spacer is partially or completely composed of an electrically insulative material.

B11.4.1. The surface charging system of paragraph B11.4, wherein the at least one spacer is partially or completely composed of a ceramic material.

C1. A system for testing surface charge, the system comprising:

the surface charging system of any of paragraphs A1-B11.4.1;

a voltage source electrically connected to the at least one electrode, a charging wire, a charging blade, or the charging mesh; and a sensor configured to measure one or more of a surface voltage potential, a surface charge density, and/or electrical field properties across the surface of the test object.

C2. The system for the testing the surface charge of paragraph C1, wherein initiating the voltage source causes the at least one electrode, the charging wire, the charging blade, or the charging mesh to reach a desired electric potential.

C3. The system for the testing the surface charge of paragraph C2, wherein the electrode or the charging mesh reaching the desired electric potential causes a charge to be deposited on the surface of the test object.

C4. The system for the testing the surface charge of any of paragraphs C1-C3, further comprising an initiation electrode with a conductive element that has a body and an exposed tip, wherein the exposed tip is positioned adjacent to the surface of test object, wherein the body of the conductive element is electrically isolated from the test object.

C4.1. The system for the testing the surface charge of paragraph C4, wherein the sensor is positioned and configured to detect a brush discharge centered at the exposed tip of the initiation electrode.

C5. The system for the testing the surface charge of any of paragraphs C1-C4.1, further comprising:

a high-voltage switch connected to the initiation electrode and configured to selectively isolate the conductive element of the initiation electrode from ground potential; and a controller programmed to operate the high-voltage switch to electrically ground the initiation electrode.

C6. The system for the testing the surface charge of any of paragraphs C1-C5, wherein the sensor is an optical sensor positioned and configured to sense light generated due to the brush discharge.

C6.1. The system for the testing the surface charge of paragraph C6.1, wherein the optical sensor is positioned and configured to sense light generated at the surface of the test object due to the brush discharge.

C6.2. The system for the testing the surface charge of any of paragraphs C6-C6.1, wherein the optical sensor is positioned and configured to detect light generated by ignition of a flammable gas in contact with the surface of the test object.

C6.3. The system for the testing the surface charge of any of paragraphs C6-C6.2, wherein the controller is programmed to operate the optical sensor to collect light from the brush discharge.

C7. The system for the testing the surface charge of any of paragraphs C1-C6.3, wherein the sensor is configured to detect ignition of a flammable gas in contact with the surface that is ignited due to the brush discharge.

C7.1. The system for the testing the surface charge of paragraph C7, wherein the sensor includes or optionally is at least one of a flame sensor, an ion sensor, a pressure sensor, a temperature sensor, a microphone, a burst diaphragm, or a conformable element.

C8. The system for the testing the surface charge of any of paragraphs C1-C7.1, wherein the initiation electrode includes an insulating sheath along the body of the conductive element.

C8.1. The system for the testing the surface charge of paragraph C8, wherein the insulating sheath of the initiation electrode is spaced apart from the surface of the test object.

C9. The system for the testing the surface charge of any of paragraphs C1-C8.1, wherein the exposed tip of the initiation electrode contacts the first surface of the dielectric layer.

C10. The system for the testing the surface charge of any of paragraphs C1-C9, wherein the initiation electrode is an insulated wire.

C11. The system for the testing the surface charge of any of paragraphs C1-C10, wherein the conductive element is a wire.

D1. A method for charging a non-planar surface of a test object, comprising:
initiating a voltage source electrically connected to an electrode;
bringing the electrode to a desired potential;
translating the electrode to a position proximate to but not in contact with the non-planar surface of the test object; and
inducing a charge on the non-planar surface of the test object.

D2. The method of paragraph D1, wherein the electrode comprises a charging mesh.

D3. The method of paragraph D1, further comprising translating the electrode across the surface of the test object, wherein during the translating of the electrode across the surface, a uniform perpendicular distance between the electrode and the surface of the test object is maintained.

D4. The method of paragraph D3, wherein the electrode is one of a charging wire and a charging blade.

D5. The method of any of paragraphs D1-D5, wherein the surface includes a planar region and a topographical feature.

D6. The method of paragraph D5, wherein the electrode is positioned such that perpendicular distances between the planar region and the electrode and perpendicular distances between the topographical feature and the electrode are the same.

D7. The method of any of paragraphs D1-D6, where the translating the electrode to a position proximate to but not in contact with the surface comprises translating the electrode towards the surface of the test object to achieve a desired perpendicular distance between the electrode and the surface of the test object.

D8. The method of any of paragraphs D1-D7, further comprising, after the translating the electrode across the surface of the test object, translating the electrode away from the surface of the test object.

D9. The method of paragraph D8, further comprising, after the translating the electrode away from the surface of the test object, turning off the voltage source.

D10. The method of any of paragraphs D1-D9, wherein the inducing the charge on the surface of the test object comprises applying a uniform amount of charge per unit area across the planar region and the topographical feature.

E1. Use of the surface charging system of any of paragraphs A1-B11.4.1 to perform the methods of any of paragraphs D1-D10.

F1. Use of the surface charging system of any of paragraphs A1-B11.4.1 to charge the surface of the test object.

G1. Use of the system for testing the surface charge of any of paragraphs C1-C11 to perform the methods of any of paragraphs D1-D10.

H1. Use of the system of for the testing the surface charge any of paragraphs C1-C11 to perform a discharge test on the surface of the test object.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only (optionally including entities other than B); in another example, to B only (optionally including entities other than A); in yet another example, to both A and B (optionally including other entities). These entities may refer to elements, actions, structures, steps, operations, values, and the like.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A surface charging system comprising:
an electrode configured to be positioned proximate to but not in contact with a surface of a test object such that perpendicular distances between the electrode and the surface of the test object are uniform across the electrode, wherein the electrode comprises a non-linear segment that is proximate to a non-planar topographical feature of the surface of the test object when the electrode is positioned proximate to but not in contact with the surface of the test object, and wherein the electrode is configured to:
be translated across the surface of the test object while maintaining the perpendicular distances between the electrode and the surface of the test object, and
impart a layer of charge across the surface of the test object when the test object is translated across the surface.

2. The surface charging system of claim 1 in combination with the test object, wherein perpendicular distances between the non-linear segment and the non-planar topographical feature are uniform across the non-linear segment.

3. The surface charging system of claim 1 in combination with the test object, wherein the surface of the test object further has a planar region, and the electrode further comprises a linear segment that is proximate to the planar region of the surface of the test object.

4. The surface charging system of claim 3, wherein a perpendicular distance between the non-linear segment and the non-planar topographical feature and a perpendicular distance between the linear segment and the planar region are constant within a threshold variance while the electrode is translated across the surface of the test object.

5. The surface charging system of claim 1 in combination with the test object, wherein the surface of the test object further has an additional non-planar topographical feature, and the electrode further comprises an additional non-linear segment proximate to the additional non-planar topographical feature.

6. The surface charging system of claim 1, wherein the electrode being configured to impart the layer of charge across the surface of the test object corresponds to the electrode being configured to impart a layer of charge across an electrically insulative surface layer of the test object.

7. The surface charging system of claim 6 in combination with the test object, wherein the test object further comprises a grounding material that is proximate to the electrically insulative surface layer, and wherein when the electrode is further configured to be positioned proximate to but not in contact with the surface of the test object such that the electrically insulative surface layer is between the grounding material and the electrode.

8. The surface charging system of claim 7, wherein the grounding material corresponds to a grounding layer that comprises an electrically conductive material that is grounded, and the electrode is further configured to impart the layer of charge across a portion of the electrically insulative surface layer proximate to the grounding material.

9. The surface charging system of claim 7, wherein the grounding material corresponds to one of a bolt, a screw, a nail, and a fastening mechanism that comprises an electrically conductive material, and the electrode is further configured to impart the layer of charge across a portion of the electrically insulative surface layer proximate to the one of the bolt, the screw, the nail, and the fastening mechanism.

10. The surface charging system claim 1, further comprising a support structure configured to:
support the electrode above the surface of the test object such that the perpendicular distances between the electrode and the surface of the test object are uniform across the electrode; and
translate the electrode in relation to the surface of the test object.

11. The surface charging system of claim 1, wherein the electrode is one of a charging wire and a charging blade.

12. A surface charging system comprising:
a charging mesh comprising a conductive material, wherein the charging mesh has a topography that corresponds to a non-planar surface of a test object, the charging mesh is positioned such that perpendicular distances between the charging mesh and the surface of the test object are uniform across the charging mesh, and the charging mesh is configured to:
be translated towards and away from the surface of the test object; and
impart a layer of charge across the surface of the test object.

13. The surface charging system of claim 12, wherein the charging mesh is partially or completely composed of an electrically conductive material, and is further configured to:
receive an applied voltage from a voltage source; and
impart the layer of charge based on the applied voltage.

14. The surface charging system of claim 12 in combination with the test object, wherein the topography of the charging mesh is such that perpendicular distances between the charging mesh and a non-planar topographical feature of the non-planar surface of the test object are uniform across the non-planar topographical feature.

15. A method for charging a non-planar surface of a test object, the method comprising:
initiating a voltage source electrically connected to an electrode;
bringing the electrode to a desired potential;
translating the electrode to a position proximate to but not in contact with the non-planar surface of the test object;
inducing a charge on the non-planar surface of the test object using the electrode; and
translating the electrode across the non-planar surface of the test object, wherein during the translating of the electrode across the non-planar surface of the test object, a uniform perpendicular distance between the electrode and the non-planar surface of the test object is maintained.

16. The method of claim 15, wherein translating the electrode to a position proximate to but not in contact with the non-planar surface of the test object comprises one of:
translating a charging wire to a position proximate to but not in contact with the non-planar surface of the test object; and
translating a charging blade to a position proximate to but not in contact with the non-planar surface of the test object.

17. A method for charging a non-planar surface of a test object, wherein the non-planar surface of the test object includes a planar region and a topographical feature, the method comprising:
 initiating a voltage source electrically connected to an electrode;
 bringing the electrode to a desired potential;
 translating the electrode to a position proximate to but not in contact with the non-planar surface of the test object;
 positioning the electrode such that perpendicular distances between the planar region and the electrode and perpendicular distances between the topographical feature and the electrode are the same; and
 inducing a charge on the non-planar surface of the test object using the electrode.

18. The method of claim 17, wherein translating the electrode to a position proximate to but not in contact with the non-planar surface of the test object comprises translating a charging mesh to a position proximate to but not in contact with the non-planar surface of the test object.

19. A method for charging a non-planar surface of a test object, the method comprising:
 initiating a voltage source electrically connected to an electrode;
 bringing the electrode to a desired potential;
 translating the electrode to a position proximate to but not in contact with the non-planar surface of the test object, wherein the translating the electrode to a position proximate to but not in contact with the non-planar surface of the test object comprises translating the electrode towards the non-planar surface of the test object to achieve a desired perpendicular distance between the electrode and the non-planar surface of the test object; and
 inducing a charge on the non-planar surface of the test object using the electrode.

20. A method for charging a non-planar surface of a test object, the method comprising:
 initiating a voltage source electrically connected to an electrode;
 bringing the electrode to a desired potential;
 translating the electrode to a position proximate to but not in contact with the non-planar surface of the test object;
 inducing a charge on the non-planar surface of the test object using the electrode;
 translating, after the translating the electrode across the non-planar surface of the test object, the electrode away from the non-planar surface of the test object; and
 after the electrode is translated away from the non-planar surface of the test object, turning off the voltage source.

* * * * *